(12) United States Patent
Eguchi et al.

(10) Patent No.: US 9,508,397 B1
(45) Date of Patent: Nov. 29, 2016

(54) NON-VOLATILE MEMORY (NVM) WITH ENDURANCE CONTROL

(71) Applicant: FREESCALE SEMICONDUCTOR, INC., Austin, TX (US)

(72) Inventors: Richard K. Eguchi, Austin, TX (US); Thomas Jew, Austin, TX (US); Craig T. Swift, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/957,778

(22) Filed: Dec. 3, 2015

(51) Int. Cl.
G11C 16/10 (2006.01)
G11C 5/14 (2006.01)
G11C 7/06 (2006.01)

(52) U.S. Cl.
CPC ............ G11C 5/147 (2013.01); G11C 7/06 (2013.01); G11C 16/10 (2013.01)

(58) Field of Classification Search
CPC .............................. G11C 16/10; G11C 5/14
USPC .............................................. 365/189.09, 226
See application file for complete search history.

(56) References Cited

U.S. PATENT DOCUMENTS

| | | | | |
|---|---|---|---|---|
| 6,038,169 A * | 3/2000 | Ogura | ............... | G11C 11/5621 365/185.11 |
| 6,493,270 B2 * | 12/2002 | Chevallier | ......... | G11C 16/3431 365/185.24 |
| 6,556,493 B2 * | 4/2003 | You | ................... | G11C 16/3445 365/185.2 |
| 7,031,193 B2 * | 4/2006 | Micheloni | ........... | G11C 11/5628 365/185.03 |
| 7,180,781 B2 * | 2/2007 | Abedifard | ............. | G11C 16/16 365/185.19 |
| 7,218,553 B2 | 5/2007 | Devin | | |
| 7,545,679 B1 * | 6/2009 | Eguchi | .................. | G11C 29/50 365/185.09 |
| 7,839,699 B2 * | 11/2010 | Higashi | ................ | G11C 7/1051 365/189.09 |
| 7,929,353 B2 * | 4/2011 | Melik-Martirosian | .. | G11C 8/10 365/185.18 |
| 8,194,461 B2 * | 6/2012 | Kosaki | ............... | G11C 11/5628 365/185.02 |
| 8,964,480 B2 * | 2/2015 | Mui | .................... | G11C 11/5635 365/185.05 |
| 9,047,948 B1 * | 6/2015 | Dinh | ................... | G11C 11/5614 |
| 9,343,141 B2 * | 5/2016 | Pang | .................. | G11C 11/5628 |

* cited by examiner

*Primary Examiner* — Michael Tran

(57) ABSTRACT

An operating voltage and reference current are adjusted in a memory device. At least a portion of an array of memory cells is preconditioned to an erased state using an erase verify voltage on word lines coupled to the memory cells and a first reference current in sense amplifiers coupled to bit lines for the array. A test reference current is set for the sense amplifiers. A bitcell gate voltage is set on the word lines to a present overdrive voltage. The at least a portion of the array is read. If any of the memory cells in the at least a portion of the array are read as being programmed, the present overdrive voltage is increased until none of the memory cells in the at least a portion of the array are read as being programmed.

19 Claims, 4 Drawing Sheets

|  | EARLY | MID | END |
|---|---|---|---|
| VGM1 | Ibit > GMREF ✓ | Ibit < GMREF x | Ibit < GMREF x |
| VGM2 | Ibit > GMREF ✓ | Ibit > GMREF ✓ | Ibit < GMREF x |
| VGM3 | Ibit > GMREF ✓ | Ibit > GMREF ✓ | Ibit > GMREF ✓ |

FIG. 3

|  | READ WL VOLTAGE | PROGRAM VERIFY VOLTAGE |
|---|---|---|
| PASSES VGM1 | WLV1 | PVV1 |
| FAILS VGM1 PASSES VGM2 | WLV2 | PVV2 |
| FAILS VGM2 PASSES VGM3 | WLV3 | PVV3 |

FIG. 4

NON-VOLATILE MEMORY (NVM) WITH ENDURANCE CONTROL

BACKGROUND

1. Field

This disclosure relates generally to non-volatile memories (NVMs), and more specifically, to NVMs with endurance control.

2. Related Art

Endurance continues to be a significant issue with non-volatile memories (NVMs). The underlying device and process technology continues to improve but is still less than what is fully desired. Circuit designs are sometimes optimized for the operating characteristics that exist after much usage so that the needed functionality is retained even as the NVM cells have reduced performance so that life is extended. These circuit designs can address a variety of issues such as programming, erasing, and sensing at the end of life. Life, however, is nonetheless desirably longer for many applications than is currently being achieved.

Accordingly, there is a need for further improvement in the endurance of NVMs.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 3 is a chart showing decision criteria useful in understanding the operation of the memory of FIG. 1;

FIG. 4 is a chart of results based on occurrences useful in understanding the operation of the memory of FIG. 1.

DETAILED DESCRIPTION

In one aspect, a non-volatile memory (NVM) has NVM cells whose characteristics change with usage. Rather than use a worst case scenario for making decisions, the word line voltage is selected based on aging characteristics for normal sensing and for program verify. The aging characteristic that is utilized is the change in transconductance with usage. The change in transconductance of a particular memory design can be characterized by experimentation. Obtaining a measure of the change in transconductance allows for using a relatively low word line voltage when the memory cells are relatively low in usage and then increasing in stages as the usage increases. The relatively low word line voltage reduces the rate of aging and thus increases the endurance of the memory cells. This is better understood by reference to the drawings and the following description.

Figure 1:
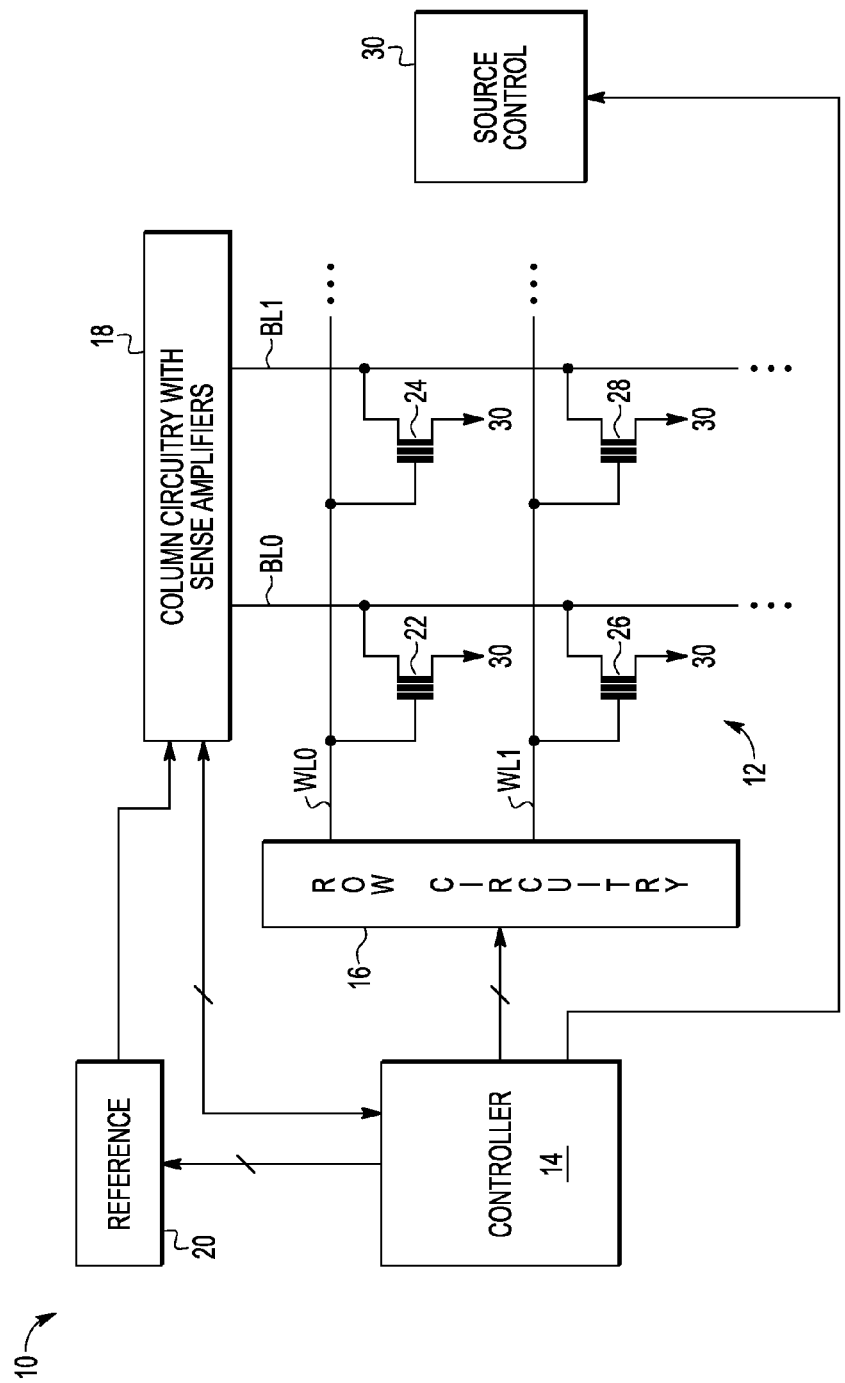
FIG. 1 is a combination block diagram and circuit diagram of a memory according to an embodiment.

Shown in FIG. 1 is a memory 10 having an array 12, a controller 14, row circuitry 16 coupled to array 12 and controller 14, column circuitry with sense amplifiers 18 coupled to controller 14, a reference circuit 20 coupled to controller 14 and column circuitry and sense amplifiers 18, and a source control 30 coupled to each of the sources of the NVM cells. Array 12 has an NVM cell 22, an NVM cell 24, an NVM cell 26, an NVM cell 28, a word line WL0 coupled to NVM cells 22 and 24, a word line WL1 coupled to NVM cells 26 and 28, a bit line BL0 coupled to NVM cells 22 and 26, and a bit line BL1 coupled to NVM cells 24 and 28. NVM cell 22 has a gate coupled to word line WL0, a drain coupled to bit line BL0, and a source connected to source control 30. NVM cell 24 has a gate coupled to word line WL0, a drain coupled to bit line BL1, and a source connected to source control 30. NVM cell 26 has a gate coupled to word line WL1, a drain coupled to bit line BL0, and a source connected to source control 30. NVM cell 28 has a gate coupled to word line WL1, a drain coupled to bit line BL1, and a source connected to source control 30. NVM cells 22, 24, 26, and 28 may use charge storage for achieving non-volatility. Examples include using a floating gate, nanocrystals, or nitride for charge storage. Reference circuit 20 produces multiple references and provides the one selected by controller 14 to column circuitry with sense amplifiers 18. Memory 10 has many more NVM cells than those shown. Controller 14 instructs the operations of reference 20, row circuitry 16, column circuitry 18, and source control 30. Column circuitry 18 operates on bit lines BL0 and BL1. Row circuitry 16 operates on word lines WL0 and WL1. Source control 30 operates on the sources of NVM cells 22, 24, 26, and 28.

Array 12 can be bulk erased, as instructed by controller 14, by row circuitry 16 applying a high negative voltage to word lines WL0 and WL1, column circuitry with sense amplifiers 18 applying a high positive voltage to the bit lines, and source control 30 applying a high positive voltage, which may be the same magnitude as the high positive voltage applied to the bit lines, to the sources. A high voltage is also applied to the substrate which is not explicitly shown in FIG. 1. This removes negative charge from the charge storage regions. Reading is achieved by precharging the bit lines, such as bit lines BL0 and BL1, enabling a selected word line, such as word line WL0, and coupling a bit line, such as bit line BL0, to a sense amplifier present in column circuitry and sense amplifiers 18. Individual programming is achieved by applying a positive voltage to a selected word line and bit line. During reading, reference circuit 20 provides the reference selected by controller 14 to column circuit with sense amplifiers 18.

The bulk erasing occurs in pulses with periodic checks, typically after each erase pulse to determine if all of the cells have been erased. The process continues until it has been verified that each cell has in fact been erased. The verification uses a sense amplifier, which can be one per bit line, from column circuitry with sense amplifiers 18 that uses a reference, reference RVREF (read/verify reference) shown in FIG. 2, from reference circuit 20. Any NVM cell that passes more current than reference RVREF is considered to have been erased. The process continues until all of the NVM cells are erased. The least erased NVM cell may have a current only slightly above the current of reference RVREF.

Figure 2:
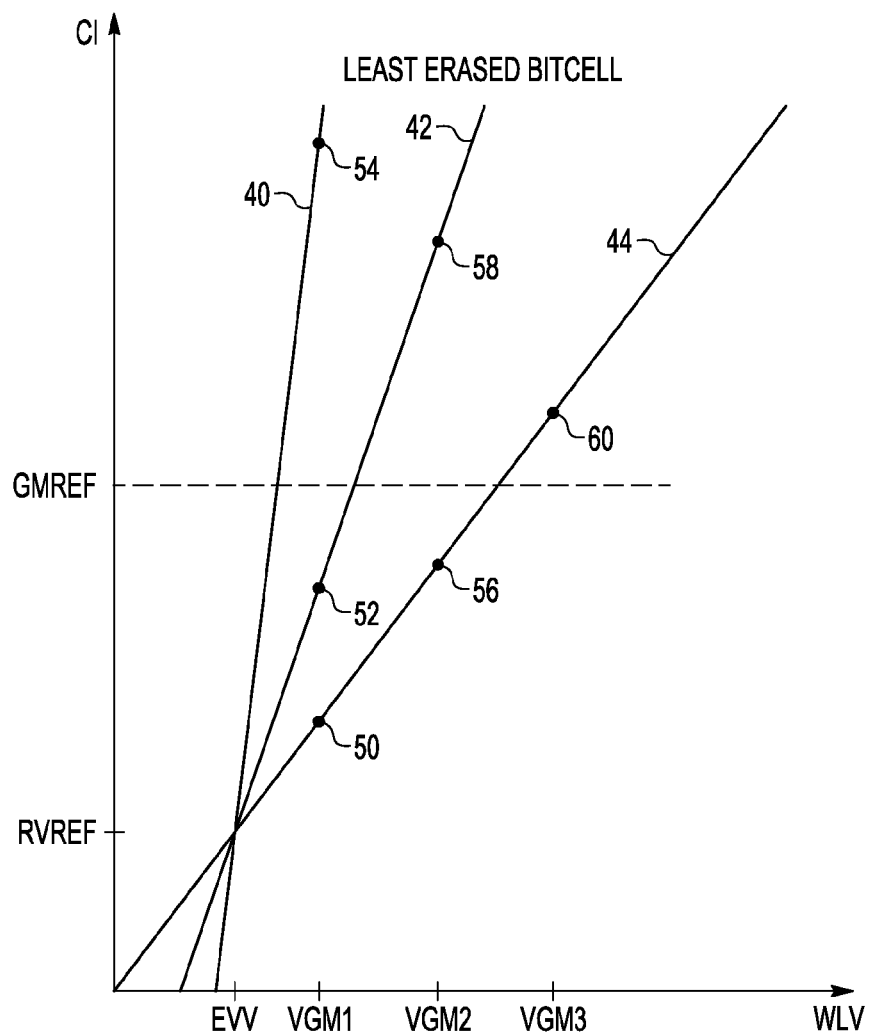
FIG. 2 is a diagram showing characteristics of a least erased bitcell useful in understanding the operation of the memory of FIG. 1.

NVM cells, like NVM cells 22-28, are characterized by having a reduction in their transconductance as they experience more program/erase cycles. Shown in FIG. 2 is a graph showing three transconductance states, in lines 40, 42, and 44, of an NVM cell such one of NVM cells 22-28. The three transconductance states may then be referenced as transconductance states 40, 42, and 44. They are straight lines as a simplified approximation plotting the current versus word line voltage, encompassing the bias conditions for sensing. One axis is cell current CI and the other is word line voltage WLV. Cell current is through bit lines BL0 and BL1 and sensed by column circuitry and sense amplifiers 18. Transconductance state 40 has the highest conductivity as is characteristic of an NVM cell having had relatively few program/erase cycles. Transconductance state 42 has an intermediate conductivity characteristic of an NVM cell near the midpoint of its program/erase cycles. Transconductance state 44 has a relatively low conductivity characteristic of an NVM cell nearer the end of its program/erase cycles. These three transconductance states can be described as early, mid, and end, respectively. Lines 40, 42, and 44 are experimentally derived and based on an average of NVM cells at their early, mid, and end conditions.

With transconductance reference current GMREF supplied to the particular sense amplifier of column circuitry and sense amplifiers 18 and a first transconductance voltage VGM1 applied to the bit line coupled to the particular sense amplifier, the measured current is at point 54 on line 40 which is well above transconductance reference GMREF. Transconductance reference GMREF is the minimum current for reliable sensing. The measured current is at point 52 on line 42 which is below transconductance reference GMREF. The measured current is at point 50 on line 44 is even further below transconductance reference GMREF which is what would be expected for an NVM cell with more program/erase cycles. Line 40 is inferred from point 54 with transconductance voltage VGM1 being applied. Similarly, line 42 is inferred from point 52, and line 44 is inferred from point 50. Based on this information and experimental data, a desired word line voltage can be selected based on this information. When possible, the lower the word line voltage the better because lower word line voltage results in less stress being applied to the NVM cells. Less stress results in longer life for the NVM cells. In this case, the points that are above transconductance reference GMREF are 54, 58, and 60. So for the case where line 40 is representative of the condition of the cell, the word line voltage associated with transconductance voltage VGM1 would be the appropriate choice. For an NVM cell represented by line 42, the word line voltage associated with transconductance voltage VGM2 would be the appropriate choice. For an NVM cell represented by line 44, the word line voltage associated with transconductance voltage VGM3 would be the appropriate choice.

The result is also shown in the table shown in FIG. 3 in which the three transconductance voltages VGM1, VGM2, and VGM3 are shown in a column on the left and along each row is shown a check for the case where the current through the cell, which may be referenced as a bitcell current Ibit, meets the requirement of transconductance reference GMREF and by an "X" when it does not for the three conditions; early, mid, and end. The proper choice is indicated by being circled.

With the information of early, mid, or end discovered through testing, in addition to adjusting the read word line voltage, the program verify voltage can also be adjusted. For the case of three possible program verify voltages PVV1 for the early case, PVV2 for the mid case, and PVV3 for the end case. The program verify is for ensuring that each NVM cell is sufficiently programmed. The amount of current being drawn by the cell should be less than some predetermined amount in order to ensure that the sense amplifier can reliable detect that the memory cell being read is programmed. When the cell has been determined to be in its early condition, then the program verify voltage can be lower than when in its mid condition. Similarly when the cell has been determined to be in its mid condition, then the program verify voltage can be lower than when in its end condition. With the cell having its condition already determined, the corresponding program verify voltage can be selected for in performing program verify. The particularly optimum program verify voltage magnitudes of program verify voltages PVV1, PVV2, and PVV3 is experimentally determined using a relatively large number memories of the same design and manufacturing processes and memory 10. A lookup table can be used to store and access the particular read word line voltage WLV1-3 and program verify voltage PVV1-3.

Thus as shown in FIG. 4, when the application of VGM1 results in a pass, read word line voltage WLV1 and program verify voltage PVV1 would be selected. Failing VGM1 and passing VGM2 results in selecting read word line WLV2 and program verify PVV2. Failing VGM2 and passing VGM3 results in selecting read word line WLV3 and program verify PVV3. The result is that for the case of the NVM cells being in the early state and the mid state, the verify and read word line voltages are lower than would be required for the end state. Unless the state is known, the end state would have to be assumed and thus the higher word line voltage for both read and program would be required to ensure that proper reading and program would occur. The higher voltage creates more stress and thus would increase the rate of aging thereby reducing the life of the memory.

Figure 5:
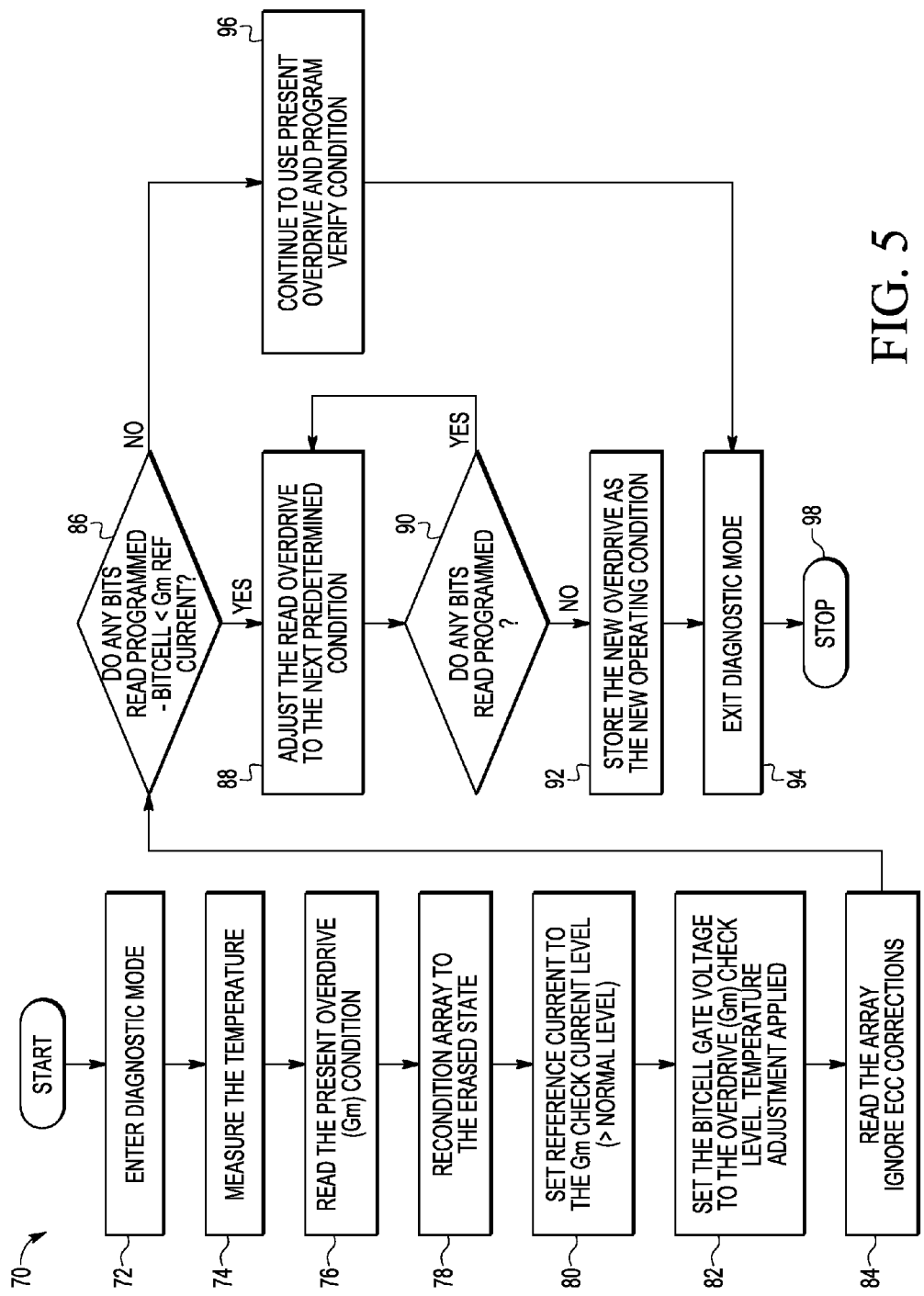
FIG. 5 is a flow diagram useful in understanding the operation of the memory of FIG. 1.

Shown in FIG. 5 is a flow diagram 70 showing the process for a diagnostic mode in which selecting the read word line voltage and program verify voltage is performed. In a step 72, the diagnostic mode is entered and the temperature is measured in a step 74. In a step 76, the present overdrive condition is read. The overdrive condition is which of the transconductance voltages VGM1-3 was last selected and currently in use for determining the word line voltage. In the alternative, the word line voltage correlating to transconductance voltage VGM1 could be the initial word line voltage. In step 78, the array is erased. The erase function can be verified by providing a reference to the sense amplifiers and an erase verify voltage, chosen to correspond to the reference, to the word lines. In a step 80, the reference current for sensing is set to transconductance reference GMVREF which is shown in FIG. 2. In a step 82, the word line voltage, which in the diagnostic mode can be called the overdrive voltage, is set to the level read in step 76. Assume in this example, the level read in step 76 is transconductance voltage VGM1. An appropriate temperature adjustment is made for this overdrive voltage. In a step 84, the array is read with the conditions of the current reference being at transconductance reference GMREF and the word line voltage and the word lines at, with a temperature adjustment, transconductance voltage VGM1. The reading in this case ignores any outlier bitcells by utilizing error correction circuitry (ECC) if it is available. The outliers could give the appearance of more aging than has actually occurred so it is better if they are ignored for this purpose. The ECC would be in controller 14. In a step 86 a determination is made if any of the NVM cells, such as NVM cells 22-28, which may also be called bitcells 22-28, have all been read as being programmed, and if not, then, in step 96 the present overdrive and program verify conditions remain and the diagnostic mode is exited at step 94.

If any of the NVM cells have been read as programmed, then the transconductance reference is incremented to VGM2 at step 88 and read again. At a step 90, it is determined if any of the bitcells read as programmed. If none are read as programmed, then at step 92 the new overdrive, VGM2 in this case, is stored as the new operating condition. If any of the bitcells are read as programmed, the transconductance reference is incremented to VGM3 again at step 88. If none of the bitcells are read as programmed, then the VGM3 is stored as the new operating condition. If any of the bitcells are read as programmed, then this may be a failure or it might be correctable by ECC. In this example VGM3 is the last available operating condition. If either VGM2 or VGM3 is the new operating condition, then the read word line voltage and the program verify voltage will change. If it is VGM2, then the read word line voltage will be read word line voltage WLV2 and the program verify voltage will be program verify voltage PVV2. If it is VGM3, then the read word line voltage will be read word line voltage WLV3 and the program verify voltage will be program verify voltage PVV3.

Thus it is seen that the life of an NVM can be extended by reducing the read word line voltage and program verify voltage by identifying when the NVM cells are not yet at the end condition. Identifying conditions, such as early and mid conditions, as existing prior to the end condition allows for safely applying less stress to the NVM cells prior to the end condition so the life of the NVM cells is extended.

By now it should be appreciated that there has been provided a memory device including an array of non-volatile memory NVM cells. The memory device further includes sense amplifiers coupled to a set of bit lines, each of the bit lines is coupled to a respective column of the NVM cells in the array. The memory device further includes row circuitry coupled to a set of word lines, each of the word lines is coupled to a respective row of the NVM cells in the array. The memory device further includes a reference generator configured to provide a first reference current and a test reference current, the first reference current is different than the test reference current. The memory device further includes a controller coupled to the reference generator and including logic instructions. The controller is configured to, during a diagnostic mode, instruct the reference generator to provide the first reference current to the sense amplifiers, and instruct the row circuitry to provide a first voltage on the word lines corresponding to the first reference current. The controller is further configured to, during the diagnostic mode, instruct the reference generator to provide the test reference current to the sense amplifiers, and instruct the row circuitry to provide a test voltage on the word lines corresponding to the test reference current. The controller is further configured to, during the diagnostic mode, determine a transconductance state of the NVM cells. The controller may further include logic instructions configured to, during normal operation, instruct the reference generator to provide the first reference current to the sense amplifiers, instruct the row circuitry to provide a voltage on the word lines corresponding to the first reference current, determine a state of the NVM cells. The controller may further include logic instructions configured to increase the voltage on the word lines during normal operation when current sensed at one of the NVM cells is less than the test reference current during the diagnostic period. The controller may further include logic instructions configured to apply a temperature adjustment to the test reference current and the test voltage. The controller may further include logic instructions configured to precondition the array to an erased state at a beginning phase of the diagnostic period. The controller may further include logic instructions configured to determine the transconductance state of the NVM cells by reading the NVM cells, using the test reference current and the test voltage, on which an erase operation was performed, and, if any of the NVM cells on which the erase operation was performed remain in a programmed state after the erase operation, determining that the transconductance state indicates higher voltage is required on the word lines to read the NVM cells during normal operation. The controller may further include logic instructions configured to adjust a voltage used during program verify operations when a higher voltage is required on the word lines during normal operation.

Also disclosed is a method of operating a non-volatile memory (NVM) device during a diagnostic mode that includes providing a first reference current to sense amplifiers. The method of operating the NVM device during a diagnostic mode further includes providing an erase verify voltage corresponding to the first reference current to word lines coupled to memory cells in the NVM device. The method of operating the NVM device during a diagnostic mode further includes providing a test reference current to the sense amplifiers. The method of operating the NVM device during a diagnostic mode further includes providing a test word line voltage corresponding to the test reference current to the word lines. The method of operating the NVM device during a diagnostic mode further includes adjusting a word line voltage on the word lines during normal operation when current sensed by the sense amplifiers on bit lines coupled to the memory cells is less than the test reference current during the diagnostic mode. The method may further include, during the diagnostic mode, measuring a temperature of the NVM device and adjusting the test reference current and the test word line voltage based on the temperature. The method may further include, during the diagnostic mode and before providing the test word line voltage, reading the word line voltage from a storage location. The method may further include, during the diagnostic mode, performing an erase operation on the memory cells. The method may further include, during the diagnostic mode and after the erase operation, reading the memory cells using the test reference current and the test word line voltage. The method may further include, during the diagnostic mode, if any of the NVM cells on which the erase operation was performed remain in a programmed state after the erase operation, using a higher voltage on the word lines to read the NVM cells during normal operation. The method may further include, during the diagnostic mode, adjusting a voltage used during a program verify operation when the higher voltage is required on the word lines. The method may have a further characterization by which the test reference current is greater than the first reference current and the test voltage is greater than the word line voltage.

Disclosed also is a method of adjusting operating voltage and reference current in a memory device including preconditioning at least a portion of an array of memory cells to an erased state using an erase verify voltage on word lines coupled to the memory cells and a first reference current in sense amplifiers coupled to bit lines for the array. The method further includes setting a test reference current for the sense amplifiers. The method further includes setting a bit cell gate voltage on the word lines to a present overdrive voltage. The method further includes reading the at least a portion of the array. The method further includes, if any of the memory cells in the at least a portion of the array are read as being programmed, increasing the present overdrive voltage until none of the memory cells in the at least a portion of the array are read as being programmed. The method may further include adjusting the present overdrive voltage based on temperature of the memory device. The method may further include storing the adjusted present overdrive voltage in memory for use in a subsequent test of the memory array. The method may further include, if any of the memory cells in the at least a portion of the array are read as being programmed, increasing a program verify voltage until none of the memory cells in the at least a portion of the array are read as being programmed.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Although the invention is described herein with reference to specific embodiments, various modifications and changes can be made without departing from the scope of the present invention as set forth in the claims below. For example, two conditions prior to the end condition were identified but more than two conditions could be used prior to reaching the end condition in a similar fashion. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory device, comprising:
   an array of non-volatile memory (NVM) cells;
   sense amplifiers coupled to a set of bit lines, each of the bit lines is coupled to a respective column of the NVM cells in the array;
   row circuitry coupled to a set of word lines, each of the word lines is coupled to a respective row of the NVM cells in the array;
   a reference generator configured to provide a first reference current and a test reference current, the first reference current is different than the test reference current;
   a controller coupled to the reference generator and including logic instructions configured to:
      during a diagnostic period,
         instruct the reference generator to provide the first reference current to the sense amplifiers, and
         instruct the row circuitry to provide a first voltage on the word lines corresponding to the first reference current;
         instruct the reference generator to provide the test reference current to the sense amplifiers, and instruct the row circuitry to provide a test voltage on the word lines corresponding to the test reference current;
         determine a transconductance state of the NVM cells; and
         apply a temperature adjustment to the test reference current and the test voltage.

2. The memory device of claim 1, the controller further comprising logic instructions configured to:
   during normal operation,
      instruct the reference generator to provide the first reference current to the sense amplifiers;
      instruct the row circuitry to provide a voltage on the word lines corresponding to the first reference current; and
      determine a state of the NVM cells.

3. The memory device of claim 2, the controller further comprising logic instructions configured to:
   increase the voltage on the word lines during normal operation when current sensed at one of the NVM cells is less than the test reference current during the diagnostic period.

4. The memory device of claim 1, the controller further comprising logic instructions configured to:
   precondition the array to an erased state at a beginning phase of the diagnostic period.

5. The memory device of claim 4, the controller further comprising logic instructions configured to:
   determine the transconductance state of the NVM cells by:
      reading the NVM cells, using the test reference current and the test voltage, on which an erase operation was performed, and
      if any of the NVM cells on which the erase operation was performed remain in a programmed state after the erase operation, determining that the transconductance state indicates higher voltage is required on the word lines to read the NVM cells during normal operation.

6. The memory device of claim 5, the controller further comprising logic instructions configured to:
   adjust a voltage used during program verify operations when a higher voltage is required on the word lines during normal operation.

7. A method of operating a non-volatile memory (NVM) device, comprising:
   during a diagnostic mode:
      providing a first reference current to sense amplifiers;
      providing an erase verify voltage corresponding to the first reference current to word lines coupled to memory cells in the NVM device;
      providing a test reference current to the sense amplifiers;
      providing a test word line voltage corresponding to the test reference current to the word lines; and
      adjusting a word line voltage on the word lines during normal operation when current sensed by the sense amplifiers on bit lines coupled to the memory cells is less than the test reference current during the diagnostic mode.

8. The method of claim 7 further comprising:
   during the diagnostic mode:

measuring temperature of the NVM device; and adjusting the test reference current and the test word line voltage based on the temperature.

9. The method of claim 7 further comprising:

during the diagnostic mode:

before providing the test word line voltage, reading the word line voltage from a storage location.

10. The method of claim 9 further comprising:

during the diagnostic mode:

performing an erase operation on the memory cells.

11. The method of claim 10 further comprising:

during the diagnostic mode:

after the erase operation, reading the memory cells using the test reference current and the test word line voltage.

12. The method of claim 11 further comprising:

during the diagnostic mode:

if any of the NVM cells on which the erase operation was performed remain in a programmed state after the erase operation, using a higher voltage on the word lines to read the NVM cells during normal operation.

13. The method of claim 12 further comprising:

during the diagnostic mode:

adjusting a voltage used during a program verify operation when the higher voltage is required on the word lines.

14. The method of claim 13 wherein:

the test reference current is greater than the first reference current; and the test voltage is greater than the word line voltage.

15. A method of adjusting operating voltage and reference current in a memory device comprising:

preconditioning at least a portion of an array of memory cells to an erased state using an erase verify voltage on word lines coupled to the memory cells and a first reference current in sense amplifiers coupled to bit lines for the array;

setting a test reference current for the sense amplifiers;

setting a bit cell gate voltage on the word lines to a present overdrive voltage;

reading the at least a portion of the array; and if any of the memory cells in the at least a portion of the array are read as being programmed, increasing the present overdrive voltage until none of the memory cells in the at least a portion of the array are read as being programmed.

16. The method of claim 15 wherein:

The test reference current is greater than the first reference current.

17. The method of claim 15 further comprising:

adjusting the present overdrive voltage based on temperature of the memory device.

18. The method of claim 17 further comprising:

storing the adjusted present overdrive voltage in memory for use in a subsequent test of the memory array.

19. The integrated circuit device of claim 15 further comprising if any of the memory cells in the at least a portion of the array are read as being programmed, increasing a program verify voltage until none of the memory cells in the at least a portion of the array are read as being programmed.

* * * * *